(12) United States Patent
Couweleers et al.

(10) Patent No.: US 9,551,563 B2
(45) Date of Patent: Jan. 24, 2017

(54) MULTI-AXIS DIFFERENTIAL INTERFEROMETER

(71) Applicant: Mapper Lithography IP B.V., Delft (NL)

(72) Inventors: Godefridus Cornelius Antonius Couweleers, Delft (NL); Thomas Adriaan Ooms, Delfgauw (NL); Niels Vergeer, Rotterdam (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/431,765

(22) PCT Filed: Sep. 26, 2013

(86) PCT No.: PCT/NL2013/050691
§ 371 (c)(1),
(2) Date: Mar. 26, 2015

(87) PCT Pub. No.: WO2014/051431
PCT Pub. Date: Apr. 3, 2014

(65) Prior Publication Data
US 2015/0241200 A1    Aug. 27, 2015

Related U.S. Application Data

(60) Provisional application No. 61/706,171, filed on Sep. 27, 2012.

(51) Int. Cl.
*G01B 9/02* (2006.01)
*G01B 11/26* (2006.01)
(Continued)

(52) U.S. Cl.
CPC ....... *G01B 9/02015* (2013.01); *G01B 9/02021* (2013.01); *G01B 9/02027* (2013.01);
(Continued)

(58) Field of Classification Search
CPC ............ G01B 9/02015; G01B 9/02051; G01B 9/02021; G01B 9/02027; G01B 11/14; G01B 11/26; G03F 7/70833; G03F 7/70775; G03F 7/7085
(Continued)

(56) References Cited

U.S. PATENT DOCUMENTS 4,504,147 A    3/1985  Huang
4,891,526 A    1/1990  Reeds
(Continued)

FOREIGN PATENT DOCUMENTS

CN    1703609 A    11/2005
CN    1916561      2/2007
(Continued)

OTHER PUBLICATIONS

Chinese Office Action with English Language Translation, dated Nov. 3, 2015, Chinese Application No. 201210091968.0.
(Continued)

*Primary Examiner* — Kara E Geisel
*Assistant Examiner* — Dominic J Bologna
(74) *Attorney, Agent, or Firm* — Blakely Sokoloff Taylor & Zafman LLP

(57) ABSTRACT

The invention relates to a multi-axis differential interferometer (1) for measuring a displacement and/or rotation between a first reflective surface (21, 321) and a second reflective surface (81, 381), wherein said measuring is carried out using at least two pairs of beams, wherein each pair is formed by a measurement beam (Mb) to be emitted onto a first one (21, 321) of said reflective surfaces, and a reference beam (Rb) to be emitted onto another one (81, 381) of said reflective surfaces, said interferometer (1) comprising: a first optical module (20) and a second optical module (40), wherein each optical module (20, 40) is
(Continued)

configured for receiving a respective coherent beam and for creating one of said pairs therefrom. The invention further relates to a lithography system comprising such an interferometer and to a method for assembling such a multi-axis differential interferometer.

19 Claims, 11 Drawing Sheets

(51) Int. Cl.
    *G03F 7/20*       (2006.01)
    *G01B 11/14*     (2006.01)
    *H01J 37/317*    (2006.01)

(52) U.S. Cl.
    CPC .......... *G01B 9/02051* (2013.01); *G01B 11/14* (2013.01); *G01B 11/26* (2013.01); *G03F 7/7085* (2013.01); *G03F 7/70775* (2013.01); *G03F 7/70833* (2013.01); *H01J 37/3174* (2013.01); *Y10T 156/10* (2015.01)

(58) Field of Classification Search
    USPC ........................................................ 356/498
    See application file for complete search history.

(56) References Cited

U.S. PATENT DOCUMENTS

| | | | |
|---|---|---|---|
| 5,719,702 A | 2/1998 | Decker | |
| 5,745,242 A | 4/1998 | Hata | |
| 5,880,838 A * | 3/1999 | Marx | G01B 11/02 250/237 G |
| 5,880,839 A | 3/1999 | Ishizuka et al. | |
| 5,949,546 A | 9/1999 | Lee et al. | |
| 6,020,963 A | 2/2000 | DiMarzio | |
| 6,122,036 A | 9/2000 | Yamasaki et al. | |
| 6,266,130 B1 | 7/2001 | Hasegawa et al. | |
| 6,331,885 B1 | 12/2001 | Nishi | |
| 6,486,955 B1 | 11/2002 | Nishi | |
| 6,507,326 B2 | 1/2003 | Manabe et al. | |
| 6,563,573 B1 | 5/2003 | Morohoshi et al. | |
| 6,757,066 B2 * | 6/2004 | Hill | G01B 9/02019 356/493 |
| 7,224,466 B2 | 5/2007 | Ray | |
| 7,298,492 B2 | 11/2007 | Tixier | |
| 7,397,570 B2 | 7/2008 | Kawasaki et al. | |
| 7,413,310 B2 | 8/2008 | Heine | |
| 7,528,960 B2 | 5/2009 | Boesser et al. | |
| 7,897,942 B1 | 3/2011 | Bareket et al. | |
| 8,462,349 B1 | 6/2013 | Rhoadarmer et al. | |
| 2003/0007158 A1 | 1/2003 | Hill | |
| 2004/0114152 A1 | 6/2004 | Hill et al. | |
| 2004/0150831 A1 * | 8/2004 | Ray | G01B 9/02027 356/493 |
| 2005/0105855 A1 | 5/2005 | Dressler | |
| 2005/0225770 A1 * | 10/2005 | Chapman | G03F 7/70775 356/498 |
| 2005/0270539 A1 | 12/2005 | Abbink | |
| 2006/0039005 A1 * | 2/2006 | Fine | G01J 9/0215 356/493 |
| 2007/0041022 A1 | 2/2007 | Schluchter | |
| 2007/0085027 A1 | 4/2007 | Baxter et al. | |
| 2007/0229841 A1 | 10/2007 | Feldman | |
| 2008/0198386 A1 | 8/2008 | Hirata et al. | |
| 2009/0135430 A1 | 5/2009 | Zhu | |
| 2009/0153822 A1 | 6/2009 | Shibazaki | |
| 2010/0183987 A1 | 7/2010 | Yonekawa | |
| 2012/0249984 A1 | 10/2012 | de Boer et al. | |
| 2012/0250026 A1 * | 10/2012 | Boer | G03F 7/70775 356/487 |
| 2012/0250030 A1 * | 10/2012 | de Boer | G03F 7/70775 356/498 |

FOREIGN PATENT DOCUMENTS

| | | |
|---|---|---|
| DE | 10348316 | 8/2004 |
| DE | 102004023030 | 12/2005 |
| EP | 1174679 | 1/2002 |
| EP | 0956518 | 1/2004 |
| EP | 0999475 | 1/2008 |
| GB | 2399186 | 9/2004 |
| JP | S60203804 A | 10/1985 |
| JP | 1184402 | 7/1989 |
| JP | 07253303 | 10/1995 |
| JP | 09-126712 | 5/1997 |
| JP | H1034385 | 8/1998 |
| JP | H11281319 | 10/1999 |
| JP | 2002141393 | 5/2002 |
| JP | 2004-228382 A | 8/2004 |
| JP | 2004239905 | 8/2004 |
| JP | 2005057222 | 3/2005 |
| JP | 2005516385 | 6/2005 |
| JP | 2006501463 | 1/2006 |
| JP | 2006170796 | 6/2006 |
| JP | 2007-121938 A | 5/2007 |
| JP | 2007-309884 A | 11/2007 |
| JP | 2007292617 | 11/2007 |
| JP | 2009115596 A | 5/2009 |
| JP | 2009-147342 | 7/2009 |
| JP | 2012500492 | 1/2012 |
| WO | WO-03033199 | 4/2003 |
| WO | WO-03067334 | 8/2003 |
| WO | WO-2004031686 | 4/2004 |
| WO | WO-2010021543 | 2/2010 |
| WO | WO-2012/134290 A1 | 10/2012 |

OTHER PUBLICATIONS

Japanese Office Action with English Language Translation, dated Dec. 28, 2015, Japanese Application No. 2014-202500.
Japanese Office Action with English Language Translation, dated Dec. 28, 2015, Japanese Application No. 2014-502500.
Harris, Paul G. et al. "Stage position measurement for e-beam lithography tool", Emerging Lithographic Technologies XI, edited by Michael J. Lercel, 10 pages.
Non-Final Office Action mailed Feb. 13, 2015, U.S. Appl. No. 13/436,741, 12 pages.
Search Report and Written Opinion of the ISA dated Feb. 14, 2014, PCT Application No. PCT/NL2013/050691, 9 pages.
Non-Final Office Action dated Jul. 7, 2015, U.S. Appl. No. 14/716,801, 16 pages.
Non-Final Office Action dated Jul. 1, 2015, U.S. Appl. No. 13/436,736, 7 pages.
Agilent, Lasers and Optics: User's Manual, vol. 1, (Sep. 2007), 310 pages.
Chapman, M., "Heterodyne and homodyne interferometry", *Renishaw*, (2000).
Dobosz, M., et al., "Interference detection system for distance measuring interferometer", *Optics & Laser Technology* 44, available online Dec. 20, 2011, (2012), pp. 1620-1628.
Lee, W., "Recent developments in homodyne interferometry", Renishaw, (Oct. 27, 2004).
Magnan, Pierre, "Detection of Visible Photons in CCD and CMOS: A Comparative View", *Nuclear Instruments and Methods in Physics Research A 504*, (2003), pp. 199-212.
Midgley, J. A., et al., "High-resolution laser homodyne interferometer", *Electronics Letters*, vol. 7, No. 5/6, (Mar. 25, 1971), pp. 117-118.
Renishaw, "RLD10 DI (Differential Interferometer) Detector Head", *L-9904-2351-04-A Data Sheet*, www.renishaw.com, (2010), 2 pages.
Schattenburg, M., et al., "Metrology for the sub-100 nm domain via fiducial grids", MIT, Cambridge, (2003).
Steila, O., et al., "Automatic In-Phase Quadrature Balancing AIQB", (Oct. 2006).
Final Office Action, dated Mar. 23, 2016, U.S. Appl. No. 13/436,736.

(56) References Cited

OTHER PUBLICATIONS

Russian Office Action with English Language Translation, dated Apr. 8, 2016, Russian Application No. 2013148110.
Japanese Office Action, dated Mar. 1, 2016, Japanese Application No. 2014-502501.
Office Action in Taiwanese Application No. 101111339 issued Jun. 15, 2016, with English translation. 11 pp.
Office Action in Japanese Application No. 2015-534420 mailed Nov. 8, 2016, with English translation. 14 pages.

* cited by examiner

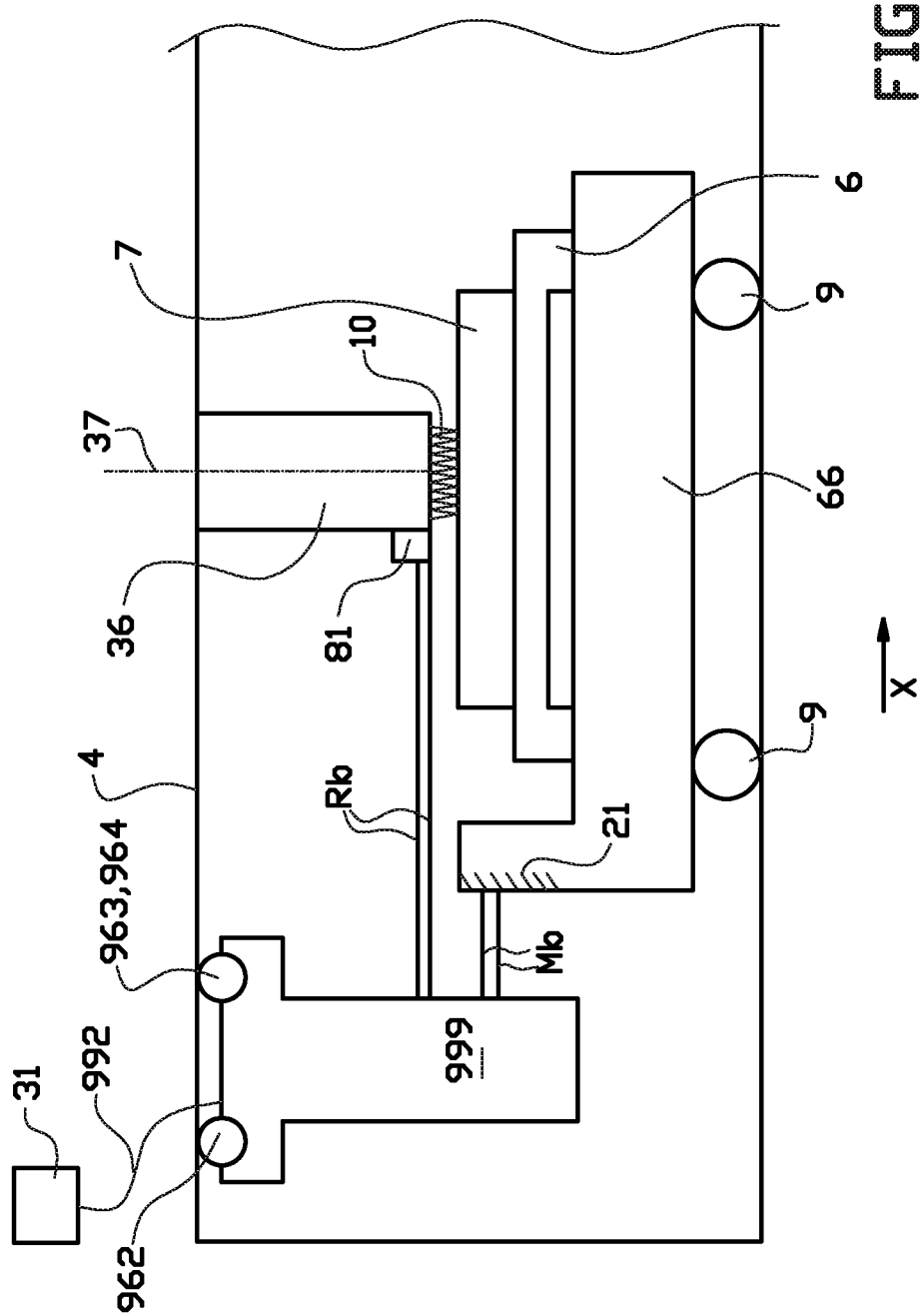

MULTI-AXIS DIFFERENTIAL INTERFEROMETER

FIELD OF THE INVENTION

The invention relates to a multi-axis differential interferometer for measuring a displacement and/or rotation between a first reflective surface and a second reflective surface. The invention further relates to a lithography system comprising such differential interferometer, and to a method for assembling such differential interferometer.

BACKGROUND OF THE INVENTION

Interferometers for measuring a stage position in an e-beam lithography tool are known. Paul. G. Harris et al. discloses an e-beam tool comprising an interferometer for measuring its stage position. The differential interferometer comprises a signal detection unit having a bi-refringent wedge for receiving a measurement beam and a reference beam that run in parallel. The wedge creates an angular deviation between the beams, and the beams then pass through a Polaroid aligned at 45° to make them interfere. The resultant interference pattern is a linear array of fringes. These fringes are aligned with an integrated linear photo-diode array, called an electrograting. The electrograting produces four electrical signals of relative phase 0°, 90°, 180°, and 270°. The gain matching of the electrograting allows the differential amplifier to remove common mode intensity changes on the signals due to an intensity change of the laser, for example, which results in a good measurement performance. Despite being a differential interferometer, the interferometer is only capable of measuring a relative position of the stage. Furthermore, the interferometer is difficult to assemble, as the optical parts in the detector must be positioned and configured carefully.

It is an object of the present invention to provide a cost effective compact multi-axis differential interferometer capable of measuring a displacement and/or rotation between a reference surface and a measurement surface. It is a further object of the present invention to provide a differential interferometer, which is relatively easy to assemble.

SUMMARY OF THE INVENTION

The invention is defined by the independent claims. The dependent claims define advantageous embodiments.

According to a first aspect, the present invention provides a multi-axis differential interferometer for measuring a displacement and/or rotation between a first reflective surface and a second reflective surface, wherein said measuring is carried out using at least two pairs of beams, wherein each pair is formed by a measurement beam to be emitted onto a first one of said reflective surfaces, and a reference beam to be emitted onto another one of said reflective surfaces, said interferometer comprising: a first optical module and a second optical module, wherein each optical module is configured for receiving a respective coherent beam and for creating one of said pairs therefrom.

According to a second aspect, the present invention provides a method of assembling a multi-axis differential interferometer, preferably a differential interferometer as described above, the method comprising the steps of:
providing a first optical module, a second optical module and a third optical module, each of said optical modules comprising:

i) a beam splitter for splitting the respective coherent beam into said measurement beam and said corresponding reference beam,
ii) a beam combiner for combining said measurement beam reflected by said first one of said reflective surfaces with its associated reference beam reflected by said another one of said reflective surfaces to a corresponding combined beam, and
iii) a beam receiver for receiving said combined beam,
said method further comprising the steps of:
arranging said optical modules in a stack to emit said three corresponding measurement beams substantially in parallel and non-coplanarly,
applying a body of adhesive between said first optical module and said second optical module and aligning said first and second optical module to each other before said body of adhesive has cured.

The effect of the features of the invention is as follows. A multi-axis differential interferometer is obtained by using two pairs of measurement-reference beams. Furthermore, each of these pairs of such beams is created in a separated optical module, which thereby increases the modularity of said interferometer significantly, and also renders the manufacturability relatively easy. The invention renders it possible to use very small optical elements inside the optical elements as each optical element only needs to create and handle one measurement beam and one reference beam.

Non-prepublished international patent application no PCT/NL2012/050209 by Applicant discloses a differential interferometer module which generates signals from which a relative displacement along one axis, e.g. the X-axis, and a rotation around two other axes, e.g. around Rz and Ry, may be derived. This differential interferometer module comprises a beam source adapted for providing three coherent beams, a beam splitter unit adapted for splitting said three beams into respective pairs of measurement beams and associated reference beams, wherein the three measurement beams are incident on a first reflective surface, and wherein the three reference beams are incident on a second reflective surface moveable with respect to said first reflective surface, at least one beam combiner for combining each reflected measurement beam with its associated reflected reference beam to a combined beam, and three beam receivers, wherein each combined beam is projected onto a corresponding detector. As only a single optical element, i.e. a single beam splitter unit, is used for splitting the three coherent beams into three measurement beams and associated reference beams, the known differential interferometer module provides a compact differential interferometer module. However, a drawback of the known module is that the dimensions of the optical elements, in particular of the beam splitter unit, must be relatively large in order to provide sufficient surface area for splitting the three coherent beams into corresponding measurement and reference beams. The cost of such large elements forms a substantial part of the cost of the module.

In an embodiment of said interferometer said optical modules have a similar configuration. Similar configurations of the optical modules leads to easier manufacturability. Preferably, said optical modules are arranged to form a side-by-side stack. The advantage is that in such configuration all measurement beams may be directed to the first one of said reflective surfaces, and likewise, all reference beams may be directed to the second one of said reflective surfaces, which results in a convenient compact solution.

Side-by-side stackable optical modules having a similar configuration render the assembly of said interferometer even easier.

In an embodiment of said interferometer said three optical modules are arranged to emit said measurement beams substantially in parallel. With this configuration it is possible to determine a displacement and/or rotation of the reference surface relative to the measurement surface in three degrees of freedom.

In an embodiment of said interferometer the optical modules are arranged in a stack. The multi-axis differential interferometer thus forms a differential interferometer stack module.

In an embodiment of said interferometer each of said optical modules comprises:
i) a beam splitter (301, 401) for splitting the respective coherent beam into said measurement beam (Mb) and said corresponding reference beam (Rb),
ii) a beam combiner (301, 401) for combining said measurement beam (Mb) reflected by said first one (21, 321) of said reflective surfaces with its associated reference beam (Rb) reflected by said another one (81, 381) of said reflective surfaces to a corresponding combined beam (Cb), and
iii) a beam receiver (305, 306, 307, 308, 309, 310, 311, 408) for receiving said combined beam (Cb).

As the beam splitter of each optical module only has to be of a dimension sufficient for splitting a single coherent beam into a corresponding measurement and reference beam, the beam splitter may be much smaller than when it is used to split multiple coherent beams into measurement and reference beams. Likewise, any other optical elements in an optical module may also be dimensioned for a single beam.

In an embodiment each of said interferometer optical modules comprises a housing forming an outer surface of said interferometer optical module. Each interferometer optical module thus forms a self contained module. A separate interferometer optical module which is adapted for emitting a single measurement beam and a single corresponding reference beam is much more easily produced, in particular more easily produced than complex differential interferometers which emit two or more measurement beams and corresponding reference beams. Preferably, the housing of an interferometer optical module completely envelops said element, thus protecting the inside of the element from dust and damage due to handling. More preferably, said housing of at least the second optical module comprises at least three sides of a rectangular cuboid, such that the first and second planar sides are two of said sides of said rectangular cuboid.

In an embodiment the second interferometer optical module comprises two parallel sides for stacking against corresponding parallel sides of the neighboring first and third interferometer optical modules, preferably wherein said two parallel sides are planar and/or substantially parallel to a direction in which said second interferometer optical module is to emit its reference beam.

In an alternative embodiment sides of neighboring optical modules comprise protrusions and corresponding cut-outs to substantially form fit with each other when the optical modules are arranged in a stack. By form fitting the optical modules with each other, the interferometer optical modules are automatically substantially aligned with each other when stacked.

In an embodiment the housing of said first interferometer optical module has a substantially planar side facing a first substantially planar side of said housing of said second interferometer optical module, and wherein said housing of said second interferometer optical module has a second substantially planar side opposite from said first substantially planar side and facing a planar side of said housing of said third interferometer optical module. When the second interferometer optical module is thus arranged between the planar side of the first interferometer optical module and the planar side of the third interferometer optical module, the three interferometer elements are substantially aligned, at least along said planes. Preferably, the first substantially planar side and the second substantially planar side of the second interferometer optical module are substantially parallel to each other.

In an embodiment said housings of said interferometer optical modules have substantially equal outer dimensions, and/or shapes. During assembly of the differential interferometer, the order in which the optical modules are stacked is thus not determined by the shape or dimensions of the housings of said optical modules.

In an embodiment said housings of said optical modules each comprise a material having a low thermal expansion coefficient, such as Zerodur™. By a low thermal expansion coefficient material is meant in particular material having a thermal expansion coefficient which is less than or substantially equal to a thermal expansion coefficient of the optics used in said optical module. Thus, when the optics, e.g. the beam-splitter and beam combiner, and/or any optics in the beam receiver, are fixed to the housing, changes in positions and/or orientations between the optics inside the housing are minimized.

In an embodiment said optical modules are attached to each other.

In an embodiment said differential interferometer further comprises a first alignment body arranged between said first optical module and said second optical module. The optical modules may thus be easily and accurately aligned relative to each other such that irregularities in the outer surfaces of the housings of the optical modules may be compensated for, and/or slight misalignments of the optics of an optical module relative to its housing are compensated for.

In an embodiment of said interferometer said measuring is carried out using three pairs of beams, wherein each pair is formed by a measurement beam and a reference beam. Furthermore, said interferometer further comprises a third optical module configured for receiving a further respective coherent beam and for creating a further pair of beams being formed by a further measurement beam and a further reference beam. The advantage of this embodiment is that the provision of the third optical module opens up the possibility to measure a further rotation of the measurement surfaces, in particular when said measurement beams are configured to emit parallel, but non-coplanar measurement beams.

In an embodiment said differential interferometer further comprises a second alignment body arranged between said second optical module and said third optical module. The optical modules may thus be easily and accurately aligned relative to each other such that irregularities in the outer surfaces of the housings of the optical modules may be compensated for, and/or slight misalignments of the optics of an optical module relative to its housing are compensated for.

In an embodiment said three optical modules (20, 40, 60) are arranged to emit said measurement beams (Mb) non-coplanarly. This arrangement opens up the possibility to measure a further rotation, next to the position and rotation which can be measurement using at least two optical modules.

In an embodiment said first alignment body comprises a body of a cured adhesive. Similarly, in an embodiment said second alignment body comprises a body of cured adhesive. In both embodiments the positions and/or orientations of the optical modules may thus easily be adjusted when the adhesive has not yet cured during assembly of the differential interferometer.

In an embodiment said first alignment body comprises a tapered shim. Similarly, in an embodiment said second alignment body comprises a tapered shim. For both embodiments, particularly in combination with a body of cured adhesive this provides a robust and well-aligned construction of the differential interferometer.

In an embodiment said reference beams are emitted in a configuration corresponding to said measurement beams. For instance, when the measurement beams are emitted in an "L"-configuration, in which the a first and a second of said measurement beams span a first plane, and in which said second and a third of said measurement beams span a second plane perpendicular to said first plane, the reference beams are emitted in the same configuration.

In an embodiment said optical modules are arranged such that their respective reference beams are emitted substantially coplanarly. In this embodiment, the differential interferometer may be of a substantially smaller dimension than a differential interferometer in which the reference beams are emitted non-coplanarly. Moreover, when a differential interferometer according to this embodiment is used in a lithography system, the volume of space required in said lithography system for passage of the reference beams and the reference beams is reduced as well.

In an embodiment, the first and third optical modules are of a same, or identical, construction, and the second optical module is of a different construction. In this embodiment the difference in construction is in particular defined by the distances between the openings for emitting the reference beam and corresponding measurement beam of each optical module, e.g. this distance is equal for the identically shaped first and third optical modules, and is different, preferably less, for the second optical module.

In an embodiment all optical modules have their respective openings oriented in an asymmetric manner in that each of said optical modules comprises an opening for letting through said measurement beam, and an opening for letting through said reference beam. Within each optical module said openings are arranged on a line and each arranged at different distances from a respective closest edge of the housing of said optical module along said line. Said first and third optical module are arranged in said differential interferometer in a same rotational orientation, and said second optical module is arranged rotated, in a plane parallel to a surface comprising said openings, 180 degrees with respect to said orientation. Said rotation is typically around an axis parallel to the direction of emission of the reference beam of the second optical module.

When all three of said optical modules are of a substantially same or identical construction, each optical module comprises an opening through which to emit its measurement beam and an opening through which to emit its reference beam. These openings are preferably arranged on a line and each arranged at different distances from a respective closest edge of the housing of said optical module along said line. If the three optical modules were arranged in a stack in identical configurations, both the measurement beams and the reference beams would be emitted in respective measurement and reference planes.

However, as according to the present embodiment the second optical module is arranged between the first and third optical module in an "upside down" configuration with respect to the first and third optical modules, the optical modules are arranged for emitting the reference beams and the measurement beams non-coplanarly. Thus a multi-axis differential interferometer is obtained capable of measuring a relative displacement and/or rotation between the reference surface and the measurement surface, wherein each of said optical modules is of a substantially same or identical construction. It must be noted at this stage that this embodiment relies upon the fact that for differential interferometers the measurement beam and the reference beam may be exchanged without hampering the performance of the device. Expressed differently, it is not relevant which beam is called the reference beam or the measurement beam. The differential interferometer is only measuring a path length difference between said beams.

In an embodiment said beam receivers of said optical modules each comprise:
  a non-polarizing beam splitter for splitting said combined beam into a first split beam and a second split beam, each split beam comprising a component of said reference beam and said measurement beam,
  a first polarizing beam splitter, for splitting said first split beam into a first polarized beam having a first polarization and a second polarized beam having a second polarization,
  a second polarizing beam splitter, for splitting said second split beam into a third polarized beam having a third polarization and a fourth polarized beam having a fourth polarization,
  a half-wave plate arranged between said non-polarizing beam splitter and said first polarizing beam splitter or between said non polarizing beam splitter and said second polarizing beam splitter, and
  a first, second, third and fourth detector for detecting a beam power of said first, second, third and fourth polarized beams respectively.

The polarizations of said first and third polarized beams are the same in this embodiment as well as said second and fourth polarized beams. However, the half-wave plate ensures that the beam polarization is rotated with 45 degrees before it reaches the second polarizing beam splitter. Thus effectively, the third detector a 135 degrees rotated polarization, and the fourth detector a 45 degrees rotated polarization. Consequently, the four detectors provide four interference signals wherein each interference signal is typically a sinusoid signal shifted in phase relative to the other signals. It is thus possible to determine a direction of displacement between said measurement reflective surface and said reference reflective surface. Moreover, by using interpolating methods between the four signals, as here described, the resolution of the measurement may be improved. As already explained, the half wave plate is arranged between the polarizing beam splitter and said first polarizing beam splitter or between said non polarizing beam splitter and said second polarizing beam splitter. The advantage is that the first polarizing beam splitter and the second polarizing beam splitter do not have to be at a 45 degree angle to each other to provide the four different polarizations. The optical elements within the optical module may thus be mounted on one side of the housing, with the sides of said optical elements which are fixed to the one side of the housing substantially parallel thereto. As a result, the volume of the optical module is substantially smaller than if it were necessary to rotate the first polarizing beam splitter relative to the second polarizing beam splitter to obtain four different polarizations at the four detectors.

In an embodiment said optical modules are arranged for emitting said reference beams substantially parallel to each other and/or for emitting said measurement beams substantially parallel to each other.

In an embodiment said beam splitter and said beam combiner of an optical module are part of a group of optical elements of said optical module, and said optical elements within an optical module are bonded to each other using optical surface bonding (also known as "Ansprengen"). Thus the optical elements are more aligned relative to each other. In fact, there is only one degree of freedom left (i.e. rotation in a plane parallel to the surface.

In an alternative embodiment said beam splitter and said beam combiner of an optical module are part of a group of optical elements of said optical module, and wherein said optical elements of an optical module of said optical modules are bonded together using an adhesive, preferably an optically neutral adhesive.

In an embodiment each of said optical modules is arranged outside a path of said reference and/or measurement beams emitted by said other optical modules. The optical modules are thus clearly separate elements which do not interfere with each other.

In an embodiment the second optical module comprises two parallel sides for stacking against corresponding parallel sides of the neighboring first and third optical modules, preferably wherein said two parallel sides are planar and/or substantially parallel to a direction in which said second optical module is to emit its reference beam.

According to a second aspect, the present invention provides a lithography system comprising:
a frame (4);
an optical column (36) for projecting a pattern onto a target, said optical column (36) being mounted to said frame (4);
a target carrier (66) for moving said target relative to the optical column (36),
wherein the target carrier (66) is provided with a first reflective surface (21), and wherein the optical column (36) is provided with a second reflective surface (81), and
at least one differential interferometer (1) as claimed in any one of the preceding claims, or described herein, for measuring a relative displacement and/or rotation between the first reflective surface (21) and a second reflective surface.

The interferometer of the invention is advantageously used in a lithography system, because of its low cost and low volume.

According to a third aspect, the present invention provides a method of assembling a differential interferometer stack module comprising the steps of
providing a first optical module, a second optical module and a third optical module, each of said optical modules comprising:
i)—a beam splitter for splitting a beam into a reference beam to be emitted a said reflective reference surface and a corresponding measurement beam to be emitted onto a reflective measurement surface,
ii)—a beam combiner for combining said measurement beam reflected by said measurement surface with its associated reference beam reflected by said reference surface to a corresponding combined beam, and
iii)—a beam receiver for receiving said combined beam, said method further comprising the steps of:

arranging said optical modules in a stack to emit said three corresponding measurement beams substantially in parallel and non-coplanarly,
applying a body of adhesive between said first optical module and said second optical module and aligning said first and second optical module to each other before said body of adhesive has cured.

Thus, pre-manufactured optical modules may be accurately aligned and bonded together to form a differential interferometer stack, or differential interferometer stack module. Once the body of adhesive has cured, the bonded optical modules form a structurally robust module.

Aligning of the first and second optical module for instance comprises emitting said reference and measurement beams from said first and second optical module onto one or more detectors for determining a position of said beams, and changing the position and/or orientation of said first optical module relative to said second optical module based on said measured beam positions.

In an embodiment the method according further comprises a step of:
applying a further body of adhesive between said second optical module and said third optical module and aligning said second and third optical module to each other before said further body of adhesive has cured.

Thus, the third optical module is aligned with the second optical module. When alignment of the first optical module with the second optical module has been performed earlier, the third optical module is thus also automatically aligned with the first optical module. Alternatively, it is possible to align the second optical module with the first and third optical module at the same time, i.e. when the adhesive body and/or the further adhesive body has not yet cured.

In an embodiment of the invention, the interferometer of the invention is charatererized in that said measurement beam and said reference beam are created using a polarizing splitter and a prism, adapted to orient said beams in parallel, each optical module comprising a housing provided with a planar surface to which optical elements are mounted, and in that each of said housings is provided with a cuboid shape.

Both the measurement beams and the reference beams are thus confined to a single plane, which allows the interferometer to be more compact than those currently known. This effect is further enhanced by mounting the optical elements on a planar surface and the cuboid shape, such that the optical modules can be nicely fitted side by side without any loose space being created in between them. Although the smaller size of the interferometer means that relatively small optical elements will have to be used this is actually another advantage as smaller optical elements are more economically (cheaper) manufactured than bigger ones.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

FIGS. 6A and 6B show schematic side views of a lithography system according to the present invention.

DETAILED DESCRIPTION OF THE INVENTION

Figure 1A:
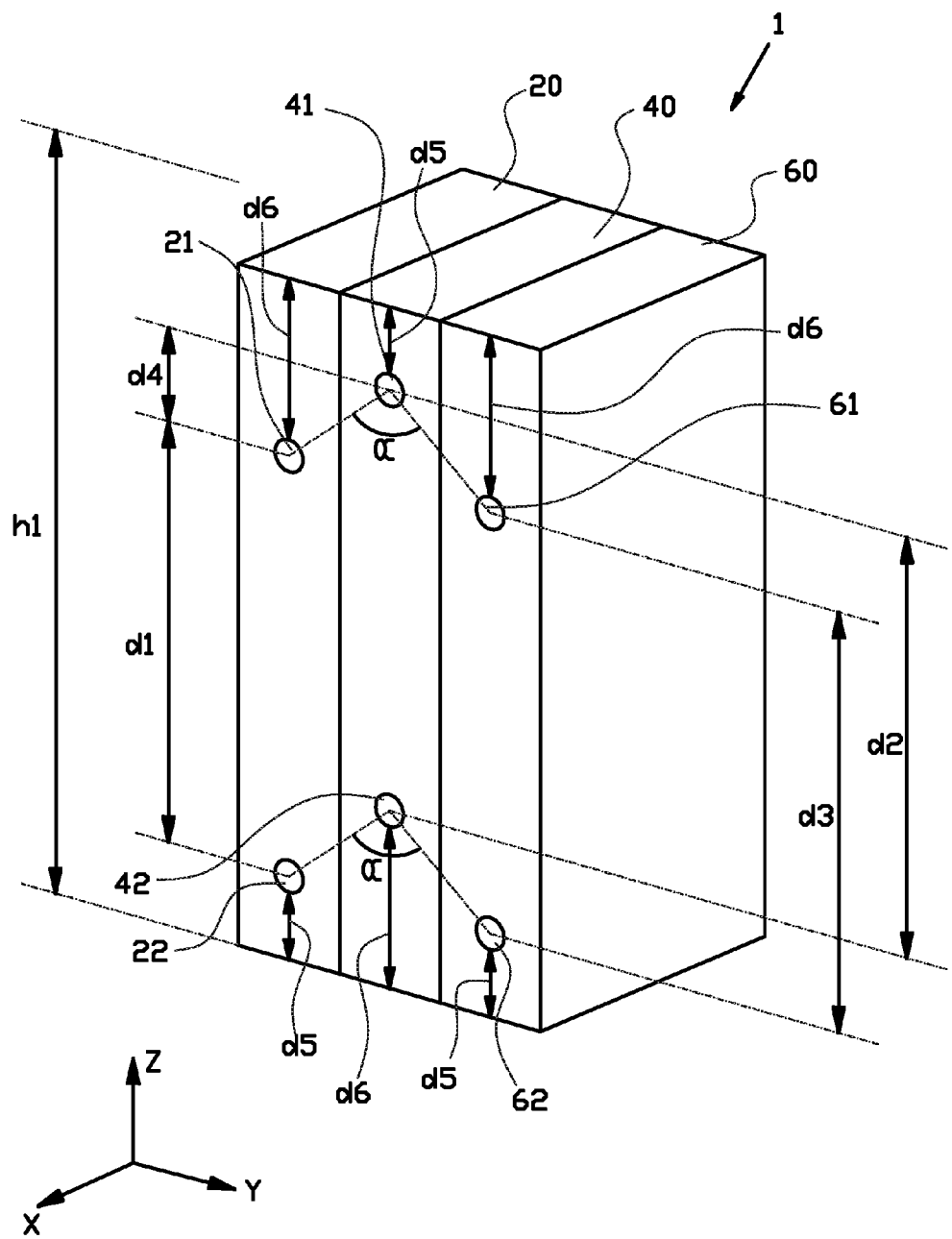
FIG. 1A shows an embodiment of a multi-axis differential interferometer (differential interferometer stack module) according to the present invention.
Figure 3:
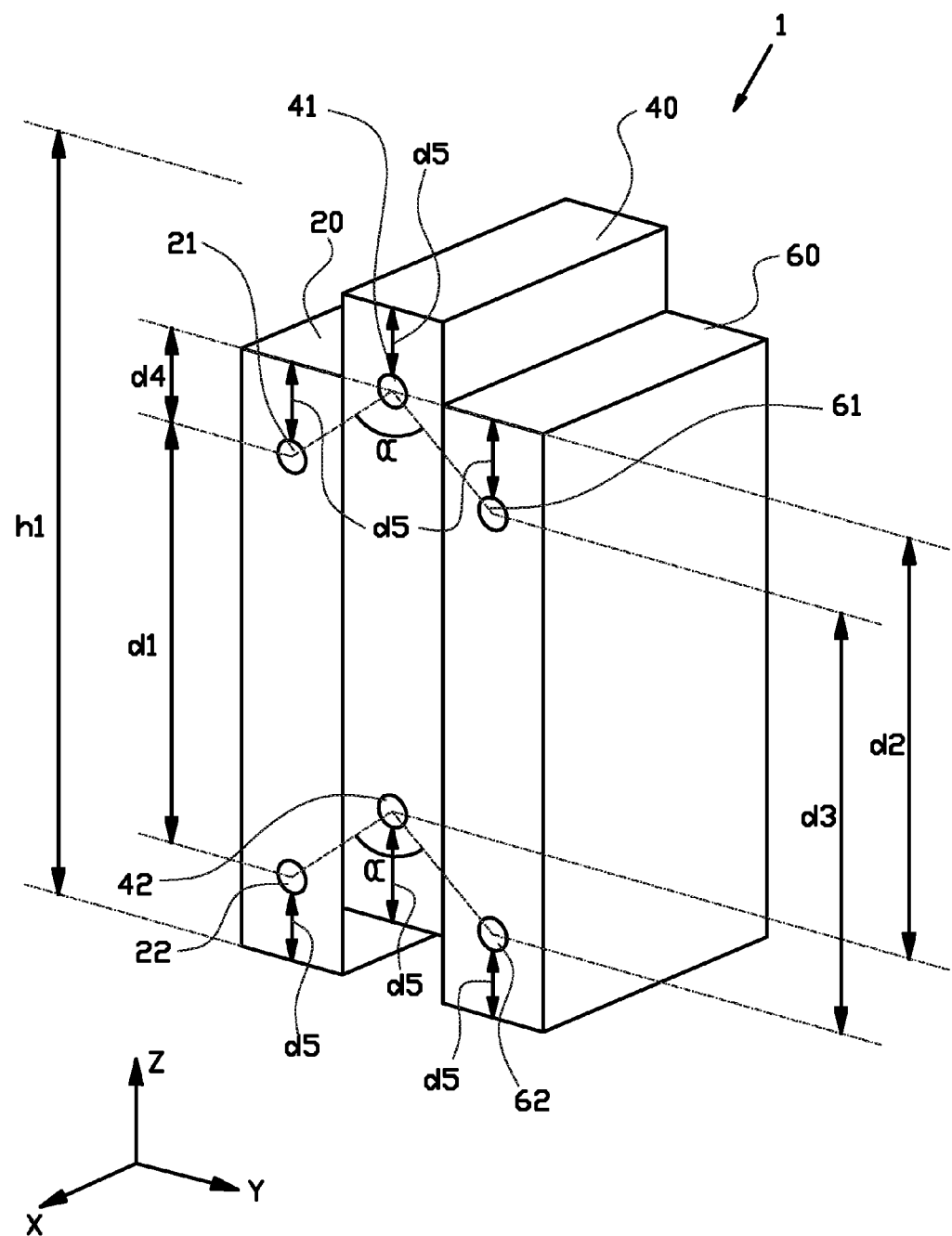
FIG. 3 shows another embodiment of a differential interferometer according to the present invention.

FIG. 1A shows a multi-axis differential interferometer 1 according to the present invention, comprising a first optical module 20, a second optical module 40 and a third optical module 60. The optical modules are arranged for emitting three measurement beams from openings 22, 42 and 62, and for emitting three corresponding reference beams from openings 21, 41 and 61. As the measurement beams and the reference beams are emitted non-coplanarly it is possible to measure displacement and/or rotation between a reflective measurement surface (first reflective surface) onto which the measurement beams are emitted and a reflective reference surface (second reflective surface) onto which the reference beams are emitted (see FIG. 3), in three degrees of freedom. For instance, a single differential interferometer 1 may be used to measure a displacement along X between a measurement surface and a reference surface, as well as a rotation around an axis Rz parallel to Z or and around an axis Ry parallel to Y between said reflective surfaces.

The optical modules 20, 40, 60 are substantially of a same construction. First optical module 20 comprises openings 21, 22 arranged on a line at distances d6 and d5 respectively from the edge closest to said respective openings on said line. Likewise, second optical module 40 comprises openings 41, 42 arranged on a line at distances d5 and d6 respectively from the edge closest to said respective openings on said line, and third optical module 60 comprises openings 61, 62 arranged on a line at distances d6 and d5 respectively from the edge closest to said respective openings on said line. The distance d1 between openings 21 and 22 is substantially equal to the distance d2 between openings 41 and 42, which in turn is substantially equal to the distance d3 between openings 61 and 62. The distance d6 between opening 21 and the closest edge of the optical module 20 along a line through opening 21 and 22 is greater than distance d4, which is the distance between openings 41 and 21 when projected onto a plane normal to a line intersecting the center of openings 21 and 61. Thus the height h1 of the differential interferometer is greater than the distance d4, i.e. the height h1 of the interferometer is at least partly dependent on said distance d4.

Though the optical modules 20,40,60 are of a same construction, the orientation of second optical module 40 in the differential interferometer 1 is flipped 180 degrees relative to the orientation of the first and third optical modules 20,60. Thus, the optical modules 20, 40, 60 are arranged for emitting reference beams and corresponding reference beams non-coplanarly respectively from openings 21,41,61 and 22,42,62. More specifically, an angle α between openings 21, 41 and 61 for the reference beams is substantially equal to angle α between corresponding openings 22, 42 and 62 for the measurement beams.

The first optical module 20 is attached to the second optical module 40 by means of a body of adhesive (see FIG. 1B), and the second optical module 20 is attached to the third optical module by means of a further body of adhesive (see FIG. 1B), thus forming a single differential interferometer stack module. During assembly of the differential interferometer stack module it is possible to align the position and/or orientation of optical modules relative to each other as long as the body of adhesive or further body of adhesive has not yet cured. Thus tolerances in manufacturing of the optical modules may be relaxed, while the elements of the resulting differential stack module, once the adhesive has cured, are accurately aligned.

Figure 1B:
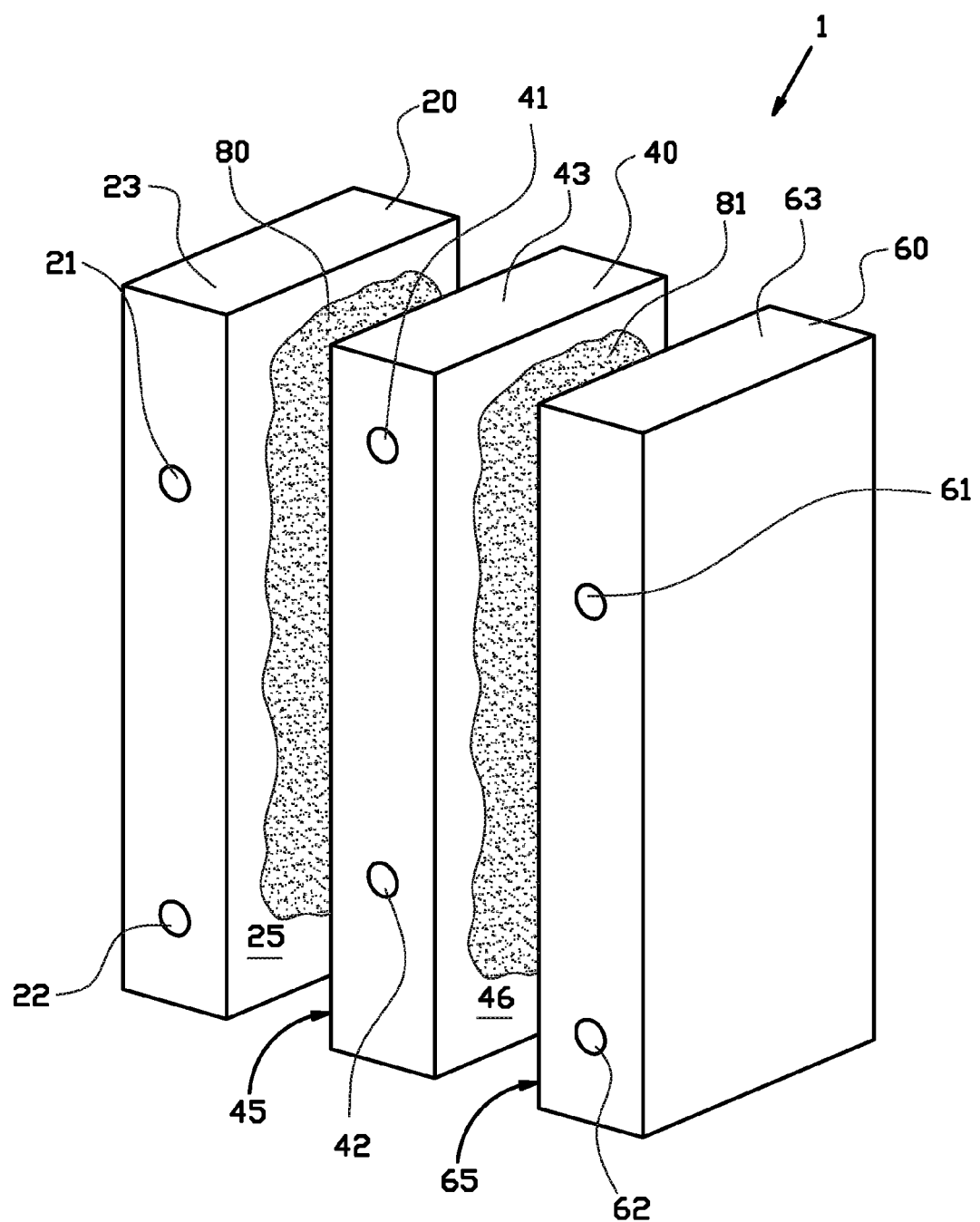
FIG. 1B shows an exploded view of a differential interferometer of FIG. 1A.

FIG. 1B shows an exploded view of the differential interferometer stack module of FIG. 1A. Each of the elements 20, 40, 60 comprises a respective housing 23, 43, 63 forming an outer surface of the respective optical module. The housing protects the interior of each optical module 20, 40, 60 against dust and also the optical modules with a robust structure. In the embodiment shown the housings 23, 43, 63 each have a substantially rectangular cuboid shape, also denoted bar shape, with planar sides facilitating stacking of the elements 20, 40, 60 on each other. Such planar sides can be machined highly accurately to specifications. Though a rectangular cuboid shape is preferred, in an alternative embodiment the second optical module comprises two parallel sides for stacking against corresponding parallel sides of the neighboring first and third optical modules, preferably wherein said two parallel sides are substantially parallel to a direction in which said second optical module is to emit its reference beam.

Yet in another alternative embodiment that sides of neighboring optical modules comprise protrusions and corresponding cut-outs to substantially form fit with each other when the optical modules are arranged in a stack.

It is important that the optical modules are designed taking proper care of thermal effects. In a first approach the housings 23, 43 and 63 may comprise material having a low thermal expansion coefficient. Errors in measurement between the reference surface and the measurement surface due to thermal expansion of the differential interferometer 1 are thus reduced or avoided. An example of a low thermal expansion coefficient material is Zerodur™. In an alternative approach, the housings may comprise a material having a thermal expansion coefficient which is substantially equal to a thermal expansion coefficient of the optics which are comprised within said housings. When such optics, e.g. the beam splitter, beam combiner and/or optics in the beam receivers (see FIG. 3), are mounted to the inside of the housing, any deformation of the optics and the housing due to thermal expansion will be substantially uniform and deformation effects are thereby reduced.

The housing 43 of the second optical module 40 comprises a substantially planar first side 45 for mounting to an opposing substantially planar side 25 of the housing 23 of first optical module 20. The housing 43 of the second optical module 40 further comprises a substantially planar second side 46, opposite from said first side 45, for mounting to an opposing substantially planar side 65 of the housing 63 of the third optical module 60.

A body of an adhesive 80 and a further body of adhesive 81 are arranged between the planar side 25 of the first optical module 20 and the first planar side 45 of the second optical module 40, and between the second planar side 46 of the second optical module 40 and the planar side 65 of the third optical module 60 respectively. During assembly of the differential stack module 1, the optical modules 20,40,60 may be aligned relative to each other as long as the body of adhesive 80 has not yet cured. It is noted that during assembly the thickness of the body of adhesive 80, which determines the distance between the side 25 of the first optical module 20 and the first side 45 of the second optical module 40, may be varied according to the requirements for alignment. The thickness of the further body of adhesive 81 may be varied likewise. Moreover, the body of adhesive and/or further body of adhesive, which form alignment bodies, may have a tapered shape or any other shape as required for alignment of the optical modules.

Figure 2A:
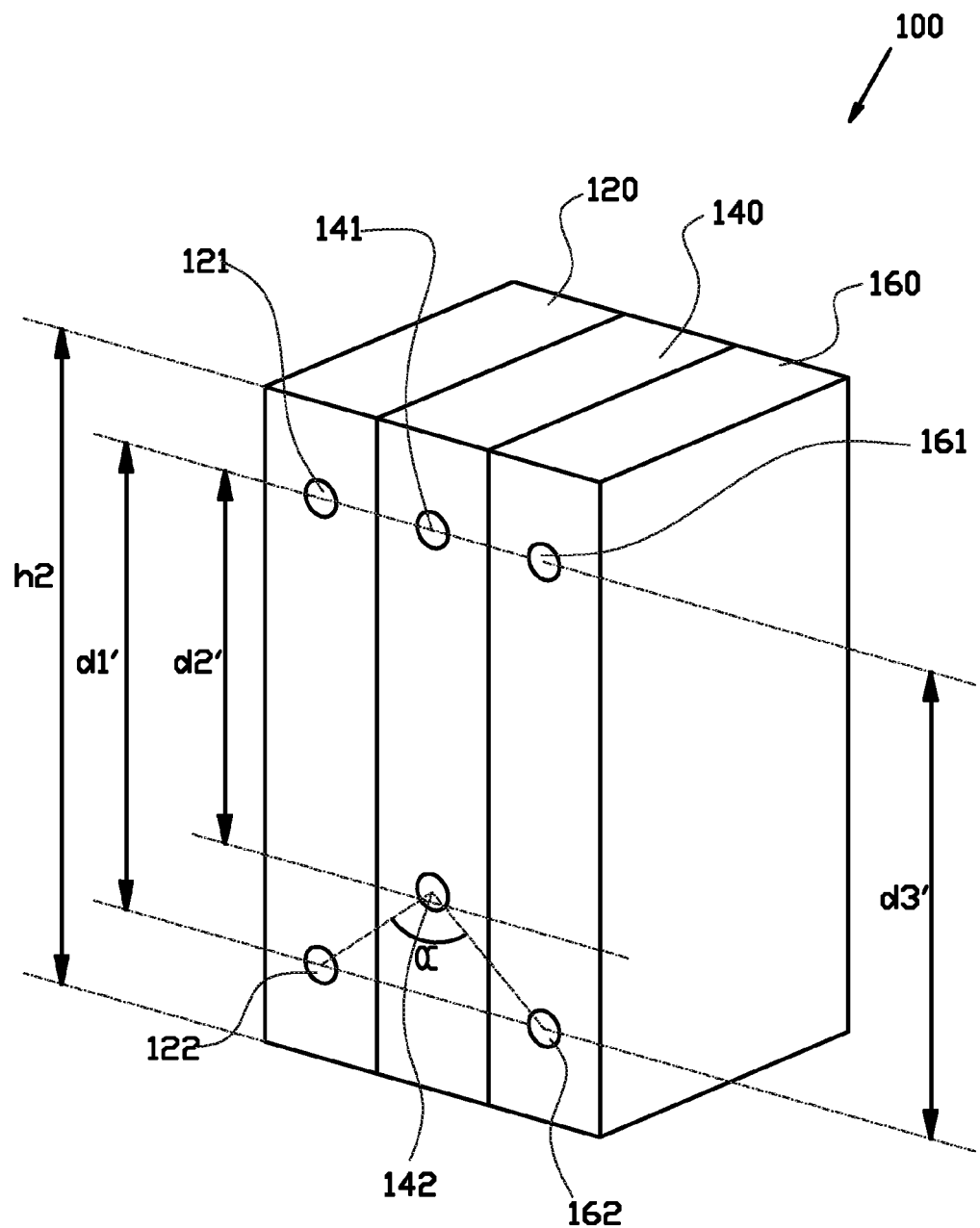
FIG. 2A shows another embodiment of a differential interferometer according to the present invention.

FIG. 2A shows a second embodiment of a differential interferometer 100 according to the present invention. The differential interferometer 100 comprises a first optical module 120, a second optical module 140 and a third optical module 160. As in the embodiment shown in FIG. 1A, each of the optical modules is differential optical module adapted for emitting a measurement beam and a corresponding reference beam. The first optical module 120 and the third optical module 160 are of a similar or identical construction. Openings 121,122 of the first optical module and openings 161,162 of the third optical module are at distances d1' and d3' from each other respectively, which distances d1' and d3' are substantially equal. Second optical module 140 is of a different construction, comprising openings 141 and 142 which are spaced apart from each other by a distance d2' which is less than said distances d1 and d3. The openings 121,141 and 161 through which the reference beams are to be emitted are arranged on a line such that the reference beams are emitted coplanarly. When openings 121 and 141 are projected on a plane normal to a line through opening 121 of the first optical module 120 and opening 161 of the second optical module 160, they coincide, i.e. in such a projection the distance between openings 121 and 141 and between openings 141 and 161 is substantially zero. As a result, the height h2 of the differential interferometer is substantially less than the height h1 of the first embodiment shown in FIG. 1A. Likewise, a volume spanned by the reference beams and the measurement beams emitted by the differential interferometer according to this second embodiment is smaller than the volume spanned by the reference and measurement beams emitted by the interferometer according to the first embodiment. The space required by the beams emitted by the differential interferometer along the direction of the height h2 is reduced as well. In many systems in which a differential interferometer is used, such as lithographic systems, space is at a premium, and any reduction in space requirements for an interferometer and the beams emitted thereby is highly desirable. A disadvantage of the embodiment of FIG. 2A is that a rotation of the reference surface is no longer affecting the measurement. Rotation of the measurement surface can still be measured, albeit that such measurement then no longer occurs differentially (no common mode rejection for this rotation measurement.

The openings 122, 142, 162 for the measurement beams are arranged in an "L-configuration", as described earlier herein, such that it remains possible to measure a displacement and/or rotation between a measurement surface and a reference surface in three degrees of freedom.

Figure 2B:
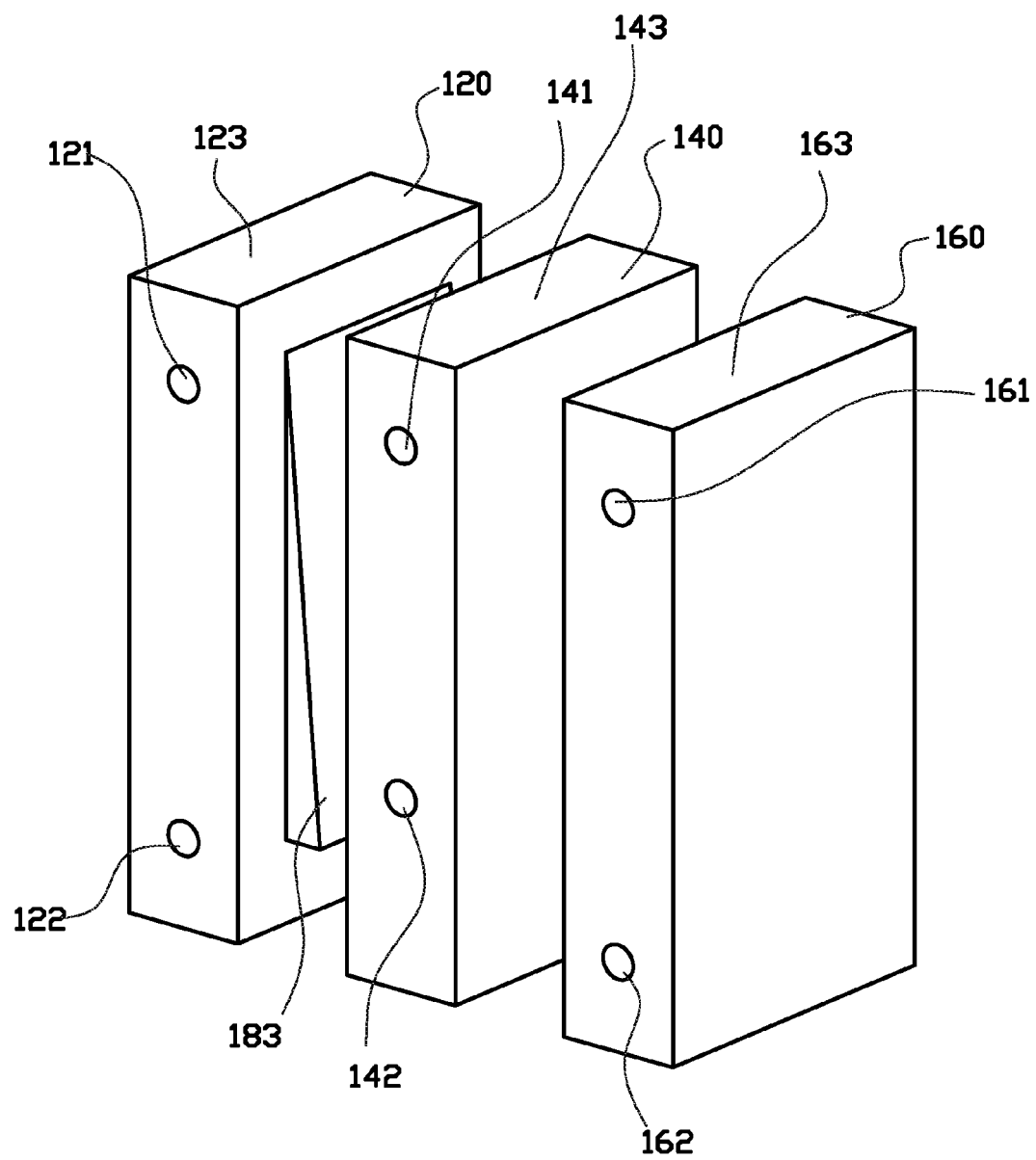
FIG. 2B shows an exploded view of a differential interferometer of FIG. 2A.

Between optical modules 120 and 140, an alignment body is arranged, which is shown in FIG. 2B.

FIG. 2B shows an exploded view of the differential interferometer of FIG. 2A. Each of the optical modules comprises a respective housing 123,143 and 163, which protects the interior of its corresponding optical module 120,140,160 respectively from damage and dust, and which provides substantially planar surfaces which facilitate stacking of the optical modules to form a complete differential interferometer, or differential interferometer stack module. When assembled, the optical modules are fixed relatively to each other, preferably by means of a body of adhesive as described earlier herein and shown in FIG. 1B. In the embodiment shown in FIG. 2B, a tapered shim 183, for instance a tapered sheet of aluminum of a ceramic material which is preferably easily machined, is arranged between the first optical module 120 and the second optical module. For reasons of clarity the width of the wide end the shim 183 has been exaggerated. One or more such shims may be used during assembly of the differential interferometer stack module for aligning the optical modules relative to each other. When the positions of the optical modules are fixed, for instance when a body of adhesive between the optical modules has cured, the shim may form part of an alignment body which keeps the optical modules aligned.

Figure 4A:
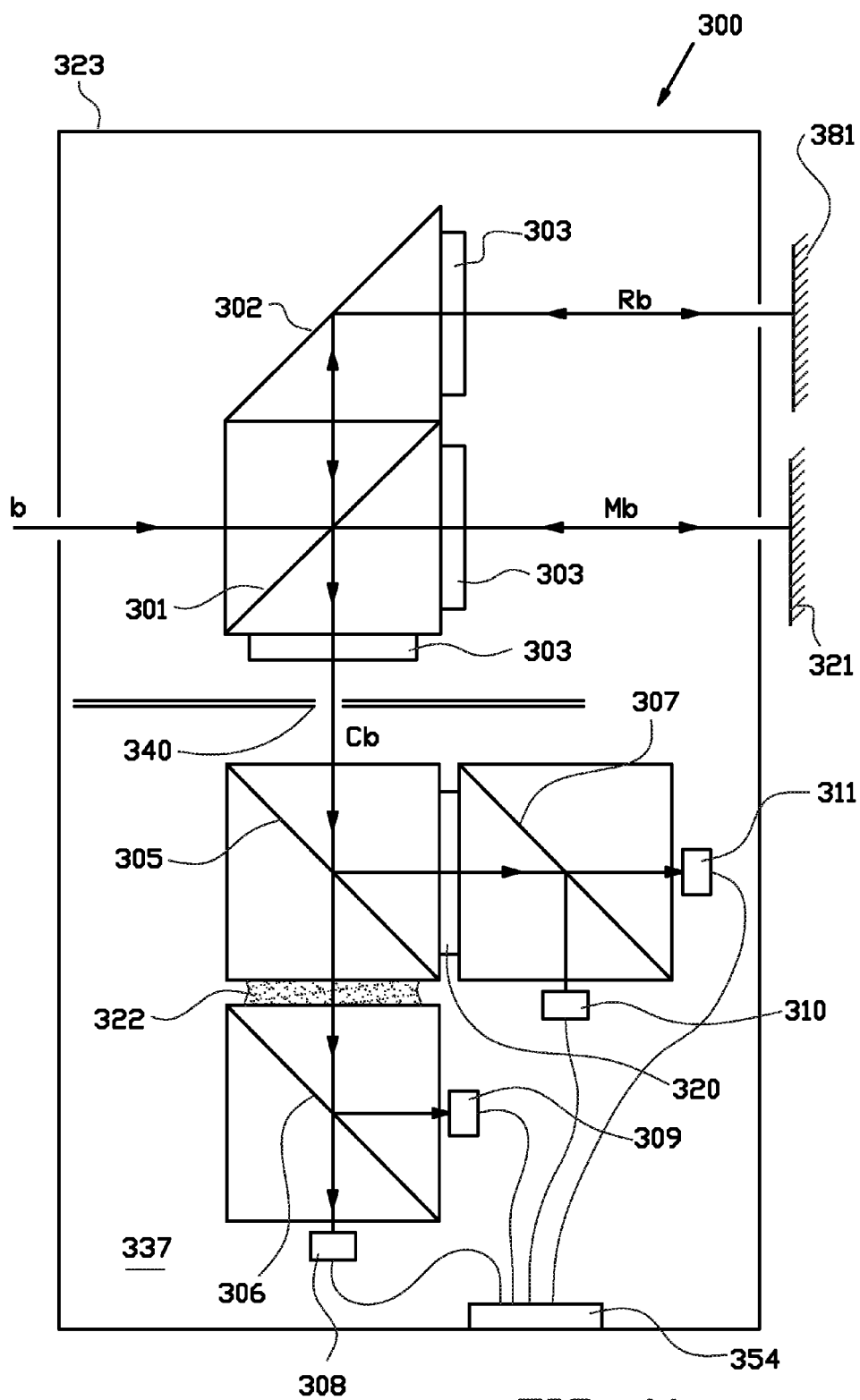
FIG. 4A schematically shows a cross sectional view of an optical module as may be included in a multi-axis differential interferometer (differential interferometer stack module) according to the present invention.

FIG. 4A shows a cross-sectional view of the interior of an optical module as used in the present invention. Typically, the interiors of the optical modules used in a differential interferometer according to the invention are similar to each other. In the optical module shown in FIG. 4A, a single coherent beam b of light is emitted onto polarizing beam splitter 301, which splits the beam b into a polarized measurement beam Mb and an associated polarized reference beam Rb. After having passed the polarizing beam splitter 301, the measurement beam Mb passes a quarter wave plate 303. The incident measurement beam is then reflected back by reflective measurement surface, or mirror, 321, and again passes the quarter wave plate 303. Subsequently the reflected measurement beam is reflected by the polarizing beam splitter 301 to pass through an iris 340.

Similarly, the part of the coherent beam that forms the reference beam Rb is reflected by prism 302 through a quarter wave plate 303 and incident on reflective reference surface, or mirror 381. The reference beam Rb is then reflected back by reflective surface 381 and again passes through the same quarter wave plate 303, after which it is reflected by prism 302, through polarizing beam splitter 301 towards iris 304.

Thus, when the optical module is active, a combined beam Cb passes the iris 304. A non-polarizing beam splitter 305 splits the combined beam into two, wherein the two combined beam portions into which the combined beam is split comprise both a portion of the reflected reference beam and a portion of the reflected measurement beam. The two beam portions in turn are split by polarizing beam splitters 306 and 307 respectively. Because a half-wave plate 320 is arranged between non-polarizing beam splitter 305 and polarizing beam splitter 307, it is not necessary to arrange polarizing beam splitter 306 at a 45 degree angle with respect to polarizing beam splitter 307 to obtain beams with four different polarizations at detectors 308,309,310 and 311.

Four distinct combined beam portions result at the detectors 308, 309, 310 and 311, two detectors 308, 311 having a parallel polarization, two having a perpendicular polarization 309, 310. A half-wave plate 320 is provided in between non-polarizing beam splitter 305 and polarizing beam splitter 307, such that, the beam in between these two elements gets a polarization which is rotated with 45 degrees. This means that effectively, the detectors 310, 311 cooperating with this non-polarizing beam splitter 305 measure a 45 degree polarization and a 135 degree polarization, respectively. Detectors 308, 309, 310 and 311 convert powers of these four combined beam portions into a four respective signals, from which a direction of displacement and a magnitude of displacement may be derived using techniques which are well known within the field of differential interferometrics. Electrical signals from the detectors are transferred via wires to a connector 354 for connection with a further processing device.

The optical module 300 comprises a housing 323 having a planar inner surface 337 to which the optical elements 301, 302, 303, 305, 306 and 307 are mounted. All of these optical elements are arranged within the housing 323 which is a substantially closed housing protecting the optical elements inside thereof against dust and handling. Half-wave plate 320 is mounted to non-polarizing beam splitter 305 and polarizing beam splitter 307 by means of optical surface mounting ("Ansprengen"). Non-polarizing beam splitter 305 is attached to polarizing beam splitter 306 using a layer of optically neutral adhesive 322.

Figure 4B:
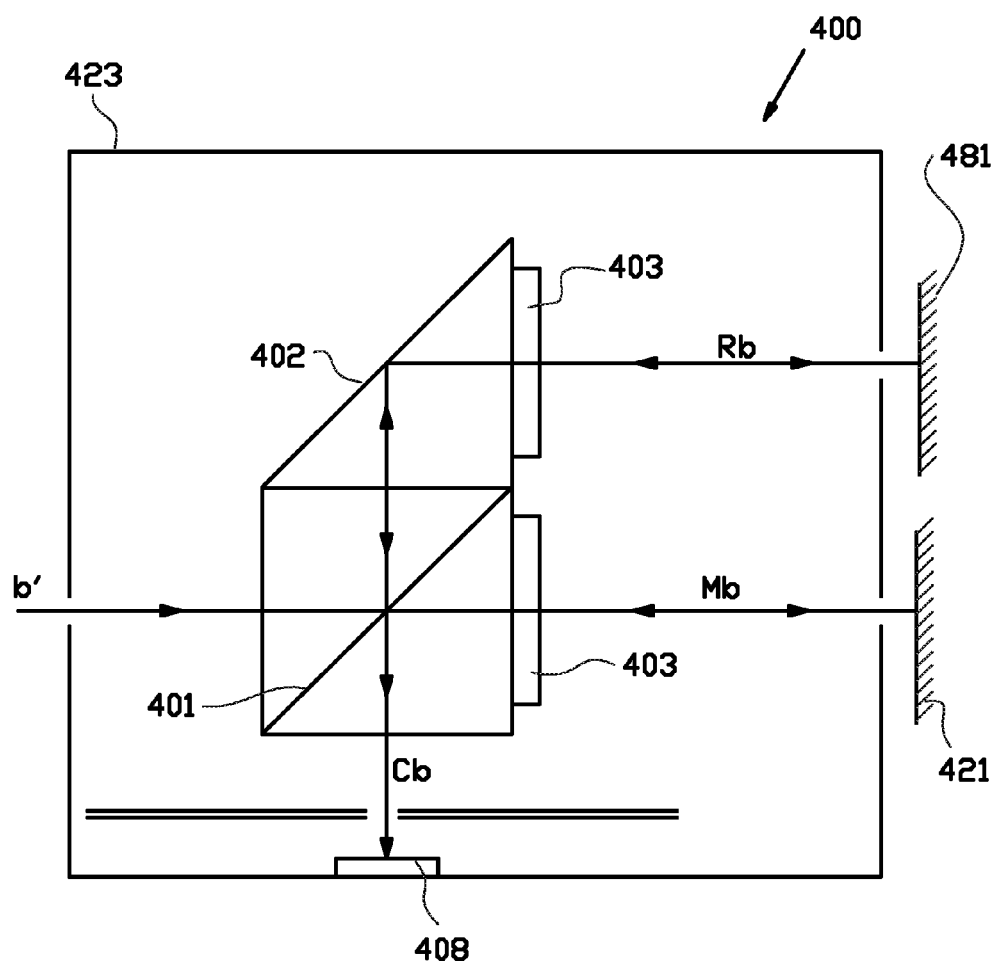
FIG. 4B schematically shows a cross sectional view of another embodiment of an optical module as may be included in a differential interferometer stack module according to the present invention.

FIG. 4B shows an alternative embodiment of a optical module as used in a differential interferometer according to the invention. Parts 400, 402, 403 and 440 correspond to the parts 300, 302, 303 and 440 of FIG. 4A. However, the embodiment of FIG. 4B is less complex than the embodiment of FIG. 4A in that the optical module 400 comprises only a single detector for measuring a power of combined beam Cb. For interference between the reflected measurement beam Mb and the reflected reference beam Rb in the combined beam it is important that both beams have a parallel polarization. If that is not the case a linear polarizer having a polarization plane in between said reflected reference beam and said reflected measurement beam may be added.

Figure 5:
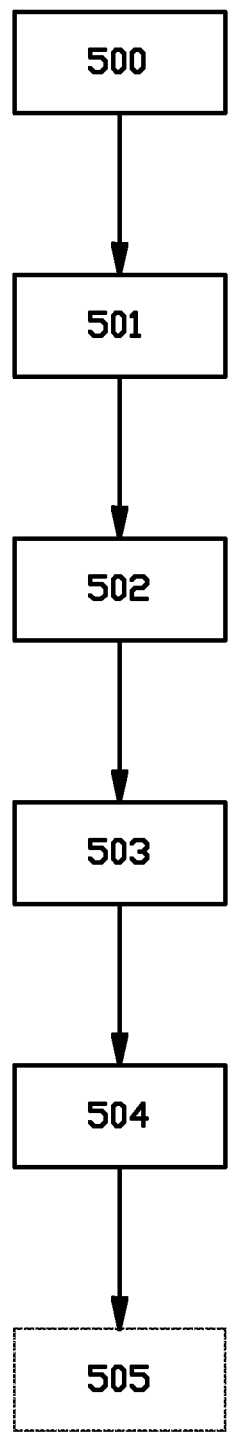
FIG. 5 shows a flow chart of steps of a method for assembling a differential interferometer stack module according to the present invention.

FIG. 5 shows a flow chart of a method for assembling a differential interferometer stack module according to the present invention. In step 500 at least three optical modules as described herein are provided, which are arranged in a stack in step 501. Next, a body of adhesive is applied between a side of the first optical module and a side of the second optical module facing said side of the first optical module. In step 503, while the adhesive has not yet cured, the first optical module and the second optical module are aligned with respect to each other. This may for instance be done by having said first and second optical modules emit measurement beams and/or reference beams onto a detector for detecting a position of said beams, and adjusting the position and/or orientation of the first optical module relative to the second optical module correspondingly. Alignment of the optical modules may also comprise inserting one or more alignment bodies, such as shims, between the first and second optical modules for spacing these elements apart. These shims may be left in place during curing of the body of adhesive, or may be removed just before the adhesive has completely cured.

During step 504 the first and second optical modules are held in place until the body of adhesive has cured. In step 505, which is optional, steps corresponding to steps 502-504 are repeated for aligning the second optical module with the third optical module. It is noted that step 505 may be performed at least partially at the same time as steps 502-504, i.e. the second optical module may be aligned with the first and third optical modules at substantially the same time.

FIG. 6A shows a lithography system according to the present invention. The system comprises a frame 4, to which an optical column 36 having an optical axis 37 is mounted. The optical column 36 is adapted for projecting a plurality of exposure beamlets 10 onto a target 7. By selectively switching selected exposure beamlets on or off, an exposure surface of the target below the optical column may be patterned. The target is placed on a wafer table 6, which in turn is placed on a chuck 66 which is moveable with respect to the optical column 36 by means of a stage 9 on which the chuck 66 is placed. In the embodiment shown, the chuck 66, wafer table 6 and stage 9 form a target carrier for moving the target 7 relative to the optical column 36.

The chuck 66 comprises a first reflective surface (or mirror) 21, comprising a substantially planar surface at substantially the same level or height within the system as the target 7 or exposure surface thereof. The optical column comprises a second reflective surface (or mirror) 81, which comprises a substantially planar surface close to the projection end of the optical column. The system further comprises a modular interferometer head 960, or differential interferometer module, which is mounted to the frame 4 by means of a kinematic mount 962, 963, 964. The modular interferometer head 960 emits reference beams Rb onto the second reflective surface 81, and associated measurement beams Mb onto the first reflective surface 21. Although not shown in this figure, the reference beams comprise three reference beams, and the measurement beams comprise three measurement beams, and a relative movement between the first reflective surface 81 and second reflective surface 21 is measured by evaluating interference between a reference beam and its associated measurement beam.

The three measurement beams Mb and the three reference beams Rb originate from a laser unit 31 which supplies a beam of coherent light, and which is coupled into the interferometer module 999 via an optical fiber 92 which forms part of a beam source for the module 999.

Figure 6B:
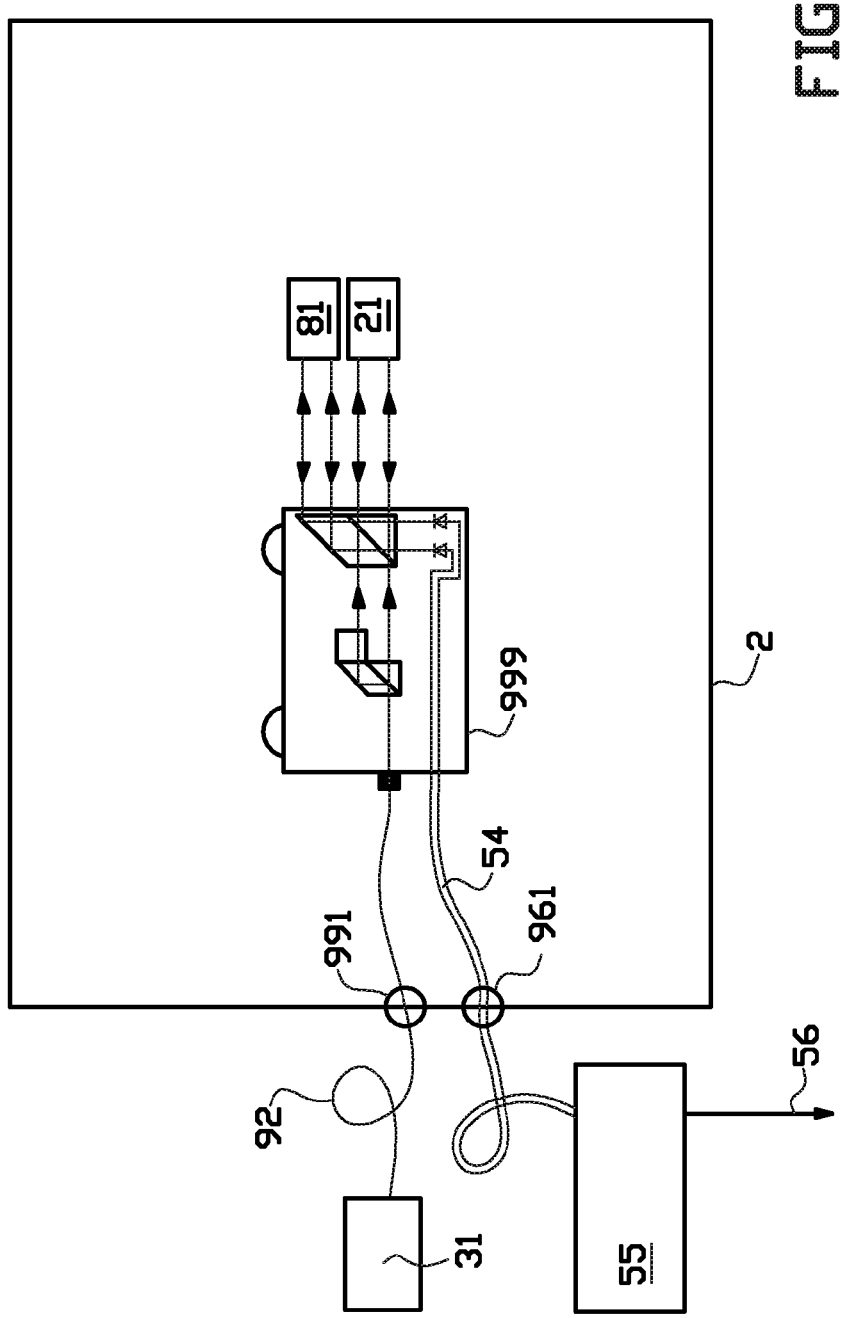

FIG. 6B schematically shows the lithography system of FIG. 6A, wherein the lithography system comprises a vacuum housing 2. Within the vacuum housing 2, only the interferometer head 960 and its connections, and first 81 and second reflective surfaces 21 are shown, though it will be understood that the target carrier of FIG. 1A will be contained within the vacuum chamber 2 as well.

The optical fiber 92 from laser 31 passes through a wall of said vacuum chamber 2 through a vacuum-tight feed-through 991. Signals representative of interference between measurement beams and their associated reference beams are transported from the interferometer module 999 out of the vacuum chamber 2 via signal wires 54, which pass through vacuum-tight feed-through 961.

Figure 6C:
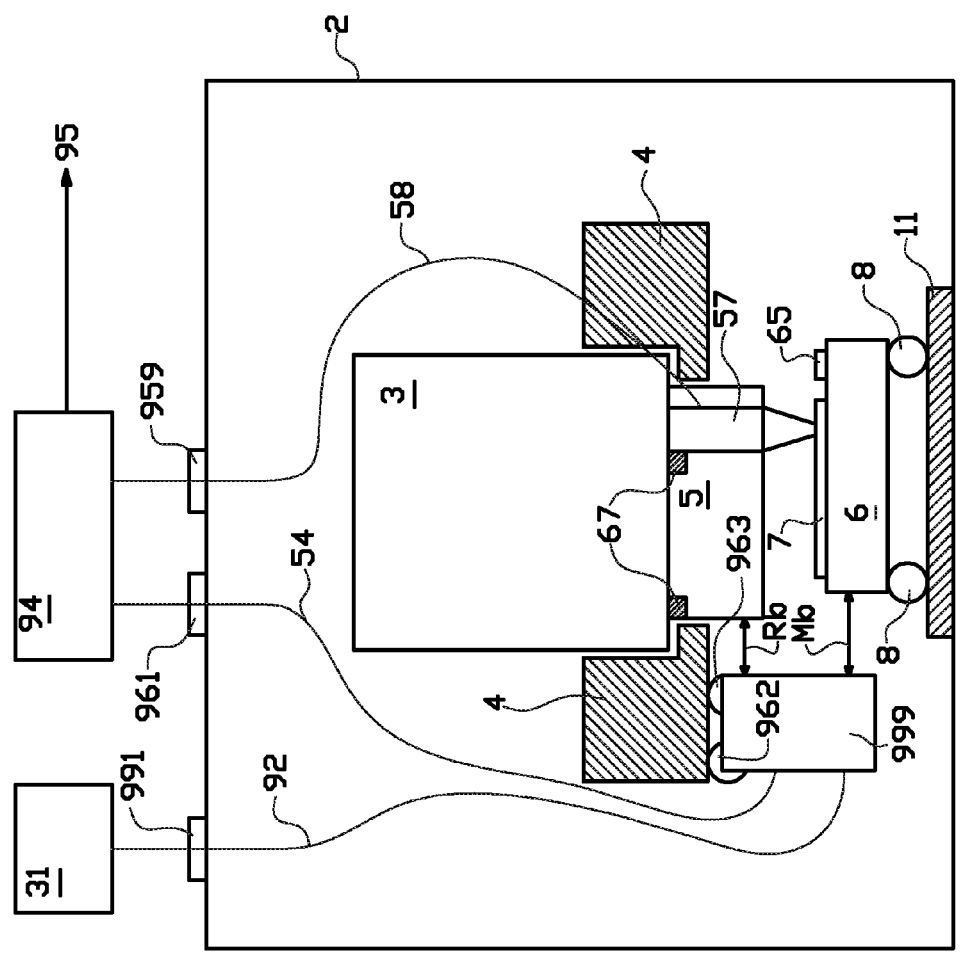
FIG. 6C shows a schematic side view of a further embodiment of a lithography system according to the present invention.

FIG. 6C schematically shows a lithography system similar to the system shown in FIG. 6A, wherein the system is a charged particle beam lithography system comprising electron optics 3 for providing a plurality of charged particle beamlets, and wherein the projection optics 5 comprise a plurality of electrostatic lenses for individually focusing said charged particle beamlets onto an exposure surface of the target 7. The projection optics 5 comprises actuators 67 for adjusting an orientation and/or position of the projection optics relative to the frame 4. The system further comprises a signal processing module 94 adapted providing a position and/or displacement signal to a stage control unit 95 for controlling movement of a stage 11. Signals are transmitted from the interferometer module 999 and the alignment sensor 57 via signal wires 54, 58 which pass through vacuum-tight feed-throughs 961 and 959, to the signal processing module 94, which processes these signals to provide a signal for actuating the stage 11 and/or the projection optics 5. The displacement of the wafer table 6, and thus of the target 7 supported thereby relative to projection optics 5 is thus continuously monitored and corrected.

In the embodiment shown, the chuck 66 is supported by a moveable stage 11 via a kinematic mount 8, and the stage 9 may be moved relative to the projection optics 5 in a direction towards or away from the interferometer module 999. The differential interferometer module 999 emits three reference beams Rb towards the reflective surface on the projection optics, and emits three measurement beams Mb towards the reflective surface on the wafer table.

In summary, the invention relates to a lithography system comprising a differential interferometer, or differential interferometer stack module for measuring a displacement and/or rotation between a first reflective surface external to said interferometer stack module and a second reflective surface external to said interferometer stack module, said interferometer stack module comprising a first optical module, a second optical module and a third optical module, wherein said second optical module is arranged between said first and third optical modules, each of said optical modules comprising means for measuring a displacement of said first reflective surface relative to said second reflective surface along a single axis. The invention further relates to such interferometer as such and to a method for assembling such a differential interferometer stack module.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

The invention claimed is:

1. A multi-axis differential interferometer (1) for measuring a displacement and/or rotation between a first reflective surface (21, 321) and a second reflective surface (81, 381), wherein said measuring is carried out using at least three pairs of beams, wherein each pair is formed by a measurement beam (Mb) to be emitted onto said first reflective surface (21, 321), and a reference beam (Rb) to be emitted onto said second reflective surface (81, 381), said interferometer (1) comprising:
a first optical module (20), a second optical module (40) and a third optical module (60), wherein each optical module (20, 40, 60) is configured for receiving a respective coherent beam and for creating one of said pairs therefrom, wherein each of said optical modules (20, 40, 60) comprises: i) a beam splitter (301, 401) for splitting the respective coherent beam into said measurement beam (Mb) and said corresponding reference beam (Rb), ii) a beam combiner (301, 401) for combining said measurement beam (Mb) reflected by said first reflective surface (21, 321) with its associated reference beam (Rb) reflected by said second reflective surface (81,381) to a corresponding combined beam (Cb), and iii) a beam receiver (305, 306, 307, 308, 309, 310, 311, 408) for receiving said combined beam (Cb),
wherein said optical modules (20, 40, 60) are arranged in a stack to form a side-by-side stack, the multi-axis differential interferometer thus forming a differential interferometer stack module, and
wherein said three optical modules (20, 40, 60) are arranged to emit said measurement beams (Mb) non-coplanarly and substantially in parallel.

2. The multi-axis differential interferometer (1) as described in claim 1, wherein said optical modules (20, 40, 60) have a similar configuration.

3. The multi-axis differential interferometer (1) according to claim 1, wherein all optical modules (20, 40, 60) have their respective openings (121, 122, 141, 142, 161, 162) oriented in an asymmetric manner in that each of said optical modules comprises an opening for letting through said measurement beam, and an opening for letting through said reference beam, wherein, within each optical module (20, 40, 60), said openings are arranged on a line and each arranged at different distances (d5, d6) from a respective closest edge of a housing of said optical module along said line, wherein said first (20) and third (60) optical module are arranged in said differential interferometer in a same rotational orientation, and wherein said second optical module (40) is arranged rotated, in a plane parallel to a surface comprising said openings, 180 degrees with respect to said orientation.

4. The multi-axis differential interferometer (1) according to claim 1, wherein the first and third optical modules are of an identical construction, and the second optical module is of a different construction, wherein the difference in construction is defined by the distances between openings for emitting the reference beam and corresponding measurement beam of each optical module, wherein this distance is equal for the identically shaped first and third optical modules, and is different for the second optical module.

5. The multi-axis differential interferometer (1) according to claim 1, wherein said beam receivers of said optical modules (20, 40, 60) each comprise:
a non-polarizing beam splitter (305) for splitting said combined beam (Cb) into a first split beam and a second split beam, each split beam comprising a component of said reference beam (Rb) and said measurement beam (Mb),
a first polarizing beam splitter (306), for splitting said first split beam into a first polarized beam having a first polarization and a second polarized beam having a second polarization,
a second polarizing beam splitter (307), for splitting said second split beam into a third polarized beam having a third polarization and a fourth polarized beam having a fourth polarization,
a half-wave plate (320) arranged between said non-polarizing beam splitter (305) and said first polarizing beam splitter (306) or between said non polarizing beam splitter (305) and said second polarizing beam splitter (307), and
a first (308), second (309), third (310) and fourth detector (311) for detecting a beam power of said first, second, third and fourth polarized beams respectively.

6. The multi-axis differential interferometer according to claim 1, wherein said optical modules are attached to each other.

7. The multi-axis differential interferometer according to claim 1, further comprising a first alignment body (80) arranged between said first optical module (20) and said second optical module (40).

8. The multi-axis differential interferometer (1) according to claim 7, wherein said first alignment body (80) and/or said second alignment body comprises a body of a cured adhesive and/or a tapered shim (183).

9. The multi-axis differential interferometer (1) according to claim 1, wherein said reference beams (Rb) are emitted in a configuration corresponding to said measurement beams (Mb).

10. The multi-axis differential interferometer according to claim 9, wherein the measurement beams are emitted in an "L"-configuration, in which a first and a second of said measurement beams span a first plane, and in which said second and a third of said measurement beams span a second plane perpendicular to said first plane, and wherein the reference beams are emitted in the same configuration.

11. The multi-axis differential interferometer (1) according to claim 10, wherein said optical modules (20, 40, 60) are arranged such that their respective reference beams (Rb) are emitted substantially coplanarly.

12. The multi-axis differential interferometer (1) according to claim 1, wherein each of said optical modules comprises a housing forming an outer surface of said optical module.

13. The multi-axis differential interferometer (1) according to claim 12, wherein the housing of said first optical module has a substantially planar side facing a first substantially planar side of said housing of said second optical module, and wherein said housing of said second optical module has a second substantially planar side opposite from said first substantially planar side and facing a planar side of said housing of said third optical module.

14. The multi-axis differential interferometer (1) according to claim 1, wherein each of said optical modules comprises a housing forming an outer surface of said optical module, wherein sides of neighboring optical modules comprise protrusions and corresponding cut-outs to substantially form fit with each other when the optical modules are arranged in a stack.

15. The multi-axis differential interferometer (1) according to claim 12, wherein said housings of said optical modules have substantially equal outer dimensions and/or shapes.

16. A multi-axis differential interferometer (1) according to claim 1, characterized in that said measurement beam and said reference beam are created using a polarizing splitter (301) and a prism (302), adapted to orient said beams in parallel, each optical module comprising a housing (323; 123; 143; 163; 23; 43; 63) provided with a planar surface (337) to which optical elements (301, 302, 303; 305, 306, 307) are mounted, and in that each of said housings is provided with a cuboid shape.

17. A lithography system comprising:
a frame (4);
an optical column (36) for projecting a pattern onto a target, said optical column (36) being mounted to said frame (4);
a target carrier (66) for moving said target relative to the optical column (36),
wherein the target carrier (66) is provided with a first reflective surface (21), and wherein the optical column (36) is provided with a second reflective surface (81), and
at least one differential interferometer (1) as described in any one of the preceding claims for measuring a relative displacement and/or rotation between the first reflective surface (21) and the second reflective surface (81).

18. A method of assembling a multi-axis differential interferometer (1) comprising the steps of:
providing a first optical module (20), a second optical module (40) and a third optical module (60), each of said optical modules comprising:
i) a beam splitter (301, 401) for splitting the respective coherent beam into said measurement beam (Mb) and said corresponding reference beam (Rb),
ii) a beam combiner (301, 401) for combining said measurement beam (Mb) reflected by said first one (21, 321) of said reflective surfaces with its associated reference beam (Rb) reflected by said another one (81, 381) of said reflective surfaces to a corresponding combined beam (Cb), and
iii) a beam receiver (305, 306, 307, 308, 309, 310, 311, 408) for receiving said combined beam (Cb),
said method further comprising the steps of:
arranging said optical modules (20, 40, 60) in a stack to emit said three corresponding measurement beams (Mb) substantially in parallel and non-coplanarly,
applying a body of adhesive (80) between said first optical module (20) and said second optical module (40) and aligning said first (20) and second optical module (40) to each other before said body of adhesive (80) has cured.

19. The method according to claim 18, further comprising the step of:
applying a further body of adhesive (81) between said second optical module (40) and said third optical module (60) and aligning said second (40) and third optical module (60) to each other before said further body of adhesive (81) has cured.

* * * * *